United States Patent
Utsunomiya et al.

(10) Patent No.: US 9,190,964 B2
(45) Date of Patent: Nov. 17, 2015

(54) DISTORTION COMPENSATION DEVICE AND DISTORTION COMPENSATION METHOD

(71) Applicant: FUJITSU LIMITED, Kawasaki-shi, Kanagawa (JP)

(72) Inventors: Yuichi Utsunomiya, Kawasaki (JP); Hiroyoshi Ishikawa, Yokohama (JP); Toshio Kawasaki, Kawasaki (JP); Alexander Nikolaevich Lozhkin, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 65 days.

(21) Appl. No.: 14/056,235

(22) Filed: Oct. 17, 2013

(65) Prior Publication Data

US 2014/0167844 A1    Jun. 19, 2014

(30) Foreign Application Priority Data

Dec. 19, 2012   (JP) ................. 2012-277474

(51) Int. Cl.
  *H03F 1/32* (2006.01)
  *H03F 3/24* (2006.01)

(52) U.S. Cl.
  CPC ............ *H03F 1/3247* (2013.01); *H03F 3/24* (2013.01)

(58) Field of Classification Search
  CPC ........................................... H03F 1/26
  USPC ....................... 330/149; 455/114.3
  See application file for complete search history.

(56) References Cited

U.S. PATENT DOCUMENTS

| | | | | |
|---|---|---|---|---|
| 6,054,896 | A | * | 4/2000 | Wright et al. ............... 330/149 |
| 7,688,138 | B2 | * | 3/2010 | Hehn ........................... 330/149 |
| 2010/0164620 | A1 | | 7/2010 | Hamada et al. |
| 2011/0163806 | A1 | | 7/2011 | Hongo |
| 2012/0098596 | A1 | | 4/2012 | Nagatani et al. |

FOREIGN PATENT DOCUMENTS

| | | |
|---|---|---|
| JP | 2010-68142 A | 3/2010 |
| JP | 2010-157898 A | 7/2010 |
| JP | 2012-90158 A | 5/2012 |
| JP | 2012-114688 A | 6/2012 |

* cited by examiner

*Primary Examiner* — Steven J Mottola
(74) *Attorney, Agent, or Firm* — Arent Fox LLP

(57) ABSTRACT

A distortion compensation device includes: a distortion compensator configured to output, to a power amplifier, a predistortion signal obtained by performing distortion compensation processing on a transmission signal by using a distortion compensation coefficient, wherein the distortion compensator limits bands of a reference signal and a feedback signal so that the bands fall in a pass band and updates the distortion compensation coefficient based on an error between the reference signal and the feedback signal, the reference signal corresponding to the predistortion signal, the feedback signal corresponding to an output feedback of the power amplifier.

17 Claims, 6 Drawing Sheets

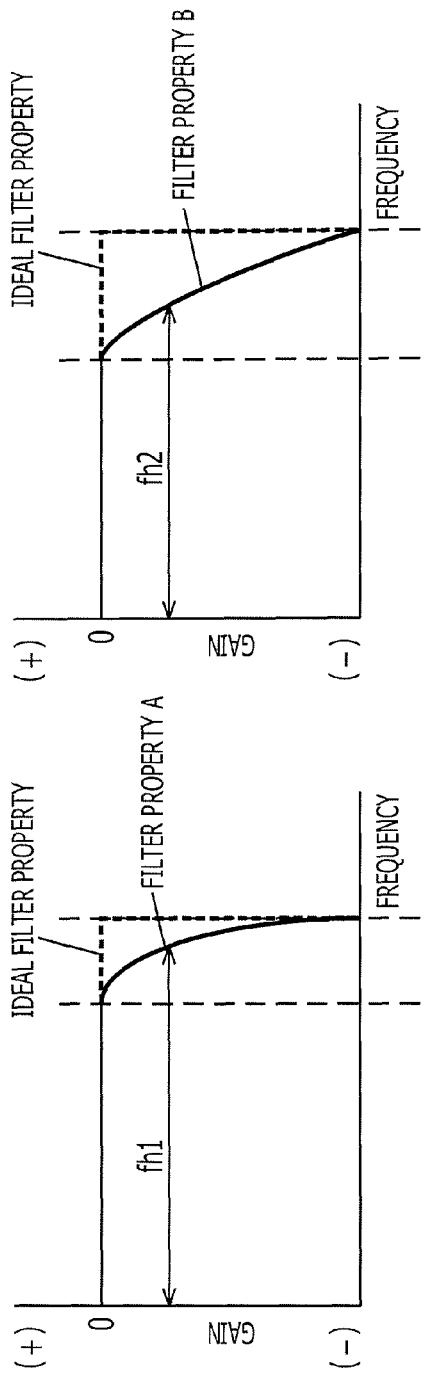

DISTORTION COMPENSATION DEVICE AND DISTORTION COMPENSATION METHOD

CROSS-REFERENCE TO RELATED APPLICATION

This application is based upon and claims the benefit of priority of the prior Japanese Patent Application No. 2012-277474, filed on Dec. 19, 2012, the entire contents of which are incorporated herein by reference.

FIELD

The embodiment discussed herein is related to a distortion compensation device and a distortion compensation method.

BACKGROUND

In a transmission device in a radio communication system, a power amplifier is used in an efficient saturation region. However, nonlinear distortion is increased when the power amplifier is used in the vicinity of the saturation region.

A related technique is disclosed in Japanese Laid-open Patent Publication No. 2012-90158.

SUMMARY

According to one aspect of the embodiments, a distortion compensation device includes: a distortion compensator configured to output, to a power amplifier, a predistortion signal obtained by performing distortion compensation processing on a transmission signal by using a distortion compensation coefficient, wherein the distortion compensator limits bands of a reference signal and a feedback signal so that the bands fall in a passband and updates the distortion compensation coefficient based on an error between the reference signal and the feedback signal, the reference signal corresponding to the predistortion signal, the feedback signal corresponding to an output feedback of the power amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A to FIG. 5D illustrate an example of a passband of a filter; and

DESCRIPTION OF EMBODIMENT

The predistortion system may reduce nonlinear distortion and an adjacent channel leakage ratio (ACLR).

In the predistortion system, a distorted signal such as a predistortion signal is preliminarily input into a power amplifier so as to reduce distortion of an output of the power amplifier. For example, a distortion compensation circuit multiplies a transmission signal by a distortion compensation coefficient, which is updated based on a transmission signal and a feedback signal of an output of the power amplifier, so as to generate a predistortion signal.

In the distortion compensation circuit, a distortion compensation coefficient is updated by using a transmission signal and a feedback signal. In a feedback loop from a DAC to an ADC on a signal path, a band of a frequency of a transmission signal is limited. For example, band limitation may be performed with a filter, which is used in interpolation processing of the DAC or a filter of a quadrature demodulator. The filter of the DAC is used for removing an image component in the interpolation processing and the filter of the quadrature demodulator is used for removing a returning component. Due to properties of these filters, a frequency component on an edge of a distortion compensation band may be cut. If update of a distortion compensation coefficient is continued in this state, distortion on the edge of the distortion compensation band which is cut by the filter may be cumulatively increased and distortion compensation performance may be degraded.

Figure 1:
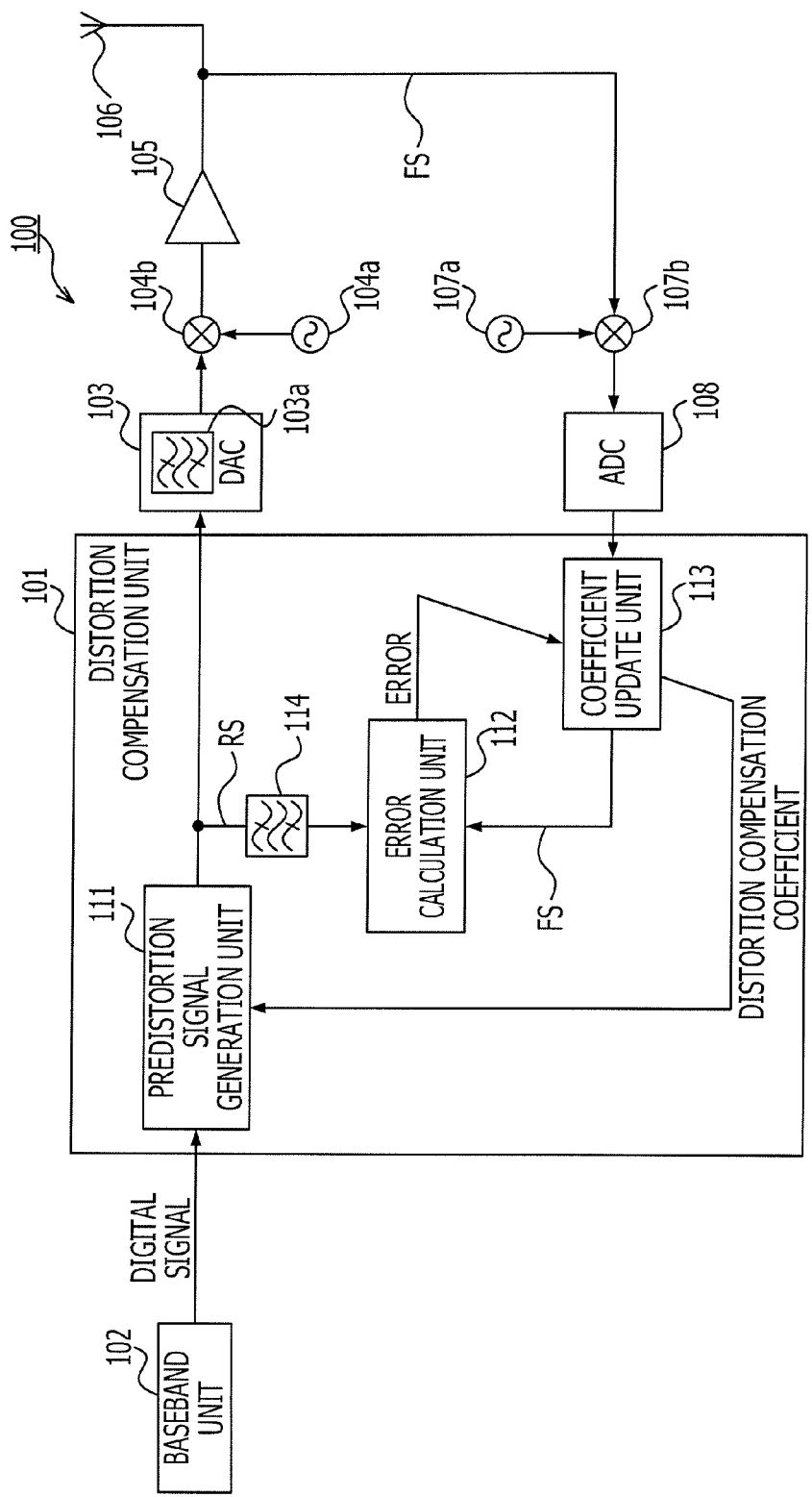
FIG. 1 illustrates an example of a distortion compensation device.

FIG. 1 illustrates an example of a distortion compensation device. In FIG. 1, a transmission device 100 which includes a power amplifier 105 is provided with a distortion compensation unit 101 and a distortion compensation of a transmission signal is performed.

To the distortion compensation unit 101, a digital signal (transmission signal) which is output from a baseband unit 102 is input. A predistortion signal generation unit 111 of the distortion compensation unit 101 performs distortion compensation corresponding to a distortion compensation coefficient, which is set with respect to the input transmission signal, so as to generate a predistortion signal.

The predistortion signal which is generated by the predistortion signal generation unit 111 is converted from a digital signal to an analog signal by a DA convertor (DAC) 103 and is frequency-converted into a transmission frequency by an oscillator 104a and a mixer 104b. The transmission signal is power-amplified by the power amplifier 105 to be wirelessly transmitted from an antenna 106.

The transmission signal after power amplification is fed back to the distortion compensation unit 101 as a feedback signal (FS). The feedback signal (FS) such as an output of the power amplifier 105 is frequency-converted into a baseband signal by an oscillator 107a and a mixer 107b and the analog signal is converted into a digital signal by an AD convertor (ADC) 108. The feedback signal (FS) which has been converted into the digital signal is input into the distortion compensation unit 101 and is used for an update of a distortion compensation coefficient.

An image component of the predistortion signal which is generated by the predistortion signal generation unit 111 is removed by a filter (103a) of the DAC 103 in the conversion from the digital signal to the analog signal performed by the DAC 103. Therefore, a band of an edge in a band of signal components may be cut. The filter 103a of the DAC 103 may correspond to a second filter.

A signal having a reversed property of distortion (predistortion signal) is input into the power amplifier 105, so that a transmission signal of which out-of-band distortion is reduced is output. An output of the power amplifier 105 is fed back to the distortion compensation unit 101 as a feedback signal (FS) and is used for the update of a distortion compensation coefficient.

The distortion compensation unit 101 includes an error calculation unit 112, a coefficient update unit 113, a filter (first filter) 114, and the like in addition to the predistortion signal generation unit 111. The filter 114 may correspond to the first filter. The distortion compensation unit 101 may include a field-programmable gate array (FPGA) which digital-processes a signal, for example. The distortion compensation unit 101 is operated through execution of a control program and thus operation control is performed. The distortion compensation unit 101 may include an ASIC.

The feedback signal (FS) is input into the coefficient update unit 113 of the distortion compensation unit 101. The coefficient update unit 113 outputs a signal, which has a reversed distortion property of the power amplifier 105, to the error calculation unit 112 by using the distortion compensation coefficient and the feedback signal (FS). The error calculation unit 112 calculates a difference between a predistortion signal (reference signal: RS) immediately after output which is generated by the predistortion signal generation unit 111 and a feedback signal (FS) as an error so as to output the calculated error to the coefficient update unit 113.

The coefficient update unit 113 updates a distortion compensation coefficient. The distortion compensation coefficient which is updated by the coefficient update unit 113 is output to the predistortion signal generation unit 111. The predistortion signal generation unit 111 generates a new predistortion signal with respect to a transmission signal based on the input distortion compensation coefficient.

Band limitation may be performed on a reference signal (RS) and a feedback signal (FS) which are used for update so as to make passbands of the reference signal (RS) and the feedback signal (FS) substantively the same as each other.

For example, in the distortion compensation unit 101, the filter 114 is provided between the predistortion signal generation unit 111 and the error calculation unit 112 (on a previous stage of the error calculation unit 112). The filter 114 limits a band of the reference signal (RS) and makes passbands of the reference signal (RS) which is input into the error calculation unit 112 and the feedback signal (FS) substantively the same as each other.

In the error calculation unit 112, two signals to be compared, for example, the reference signal (RS) and the feedback signal (FS) are compared with each other in the substantively the same band, so that an error caused by a difference of bands may not be generated. Distortion rise on a part on an edge of a distortion compensation band may be reduced and distortion compensation performance may be improved by the simple configuration in which a filter in which a passband is set is provided.

Figure 2:
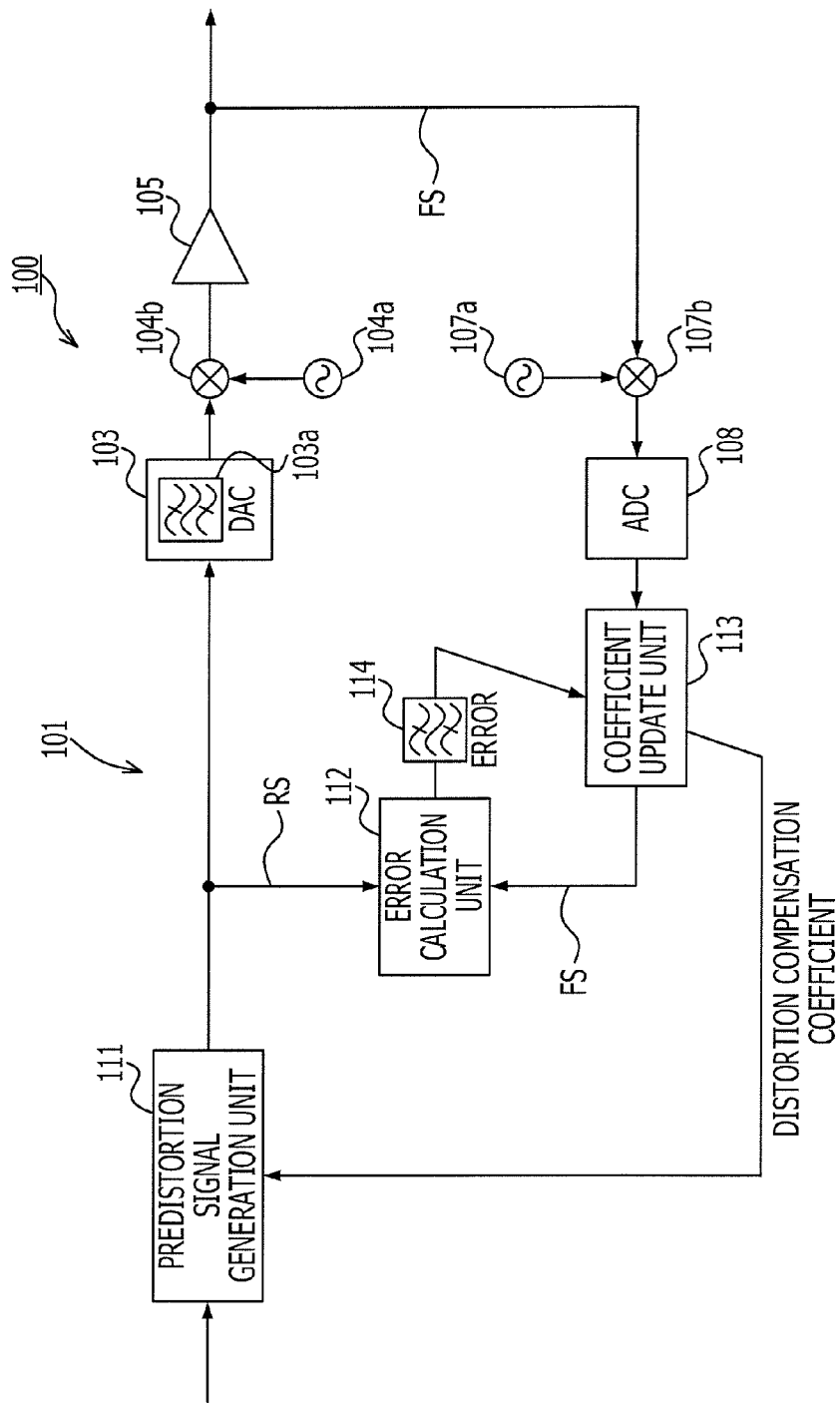
FIG. 2 illustrates an example of a distortion compensation device.

FIG. 2 illustrates an example of a distortion compensation device. In FIG. 2, elements which are substantively the same as or similar to the elements depicted in FIG. 1 may be given the same reference characters and description thereof may be omitted or reduced. The filter 114 may be disposed on an output (following stage) of the error calculation unit 112.

The filter 114 is provided on the output of the error calculation unit 112, and thus a band of a detected error signal is limited. Equivalently, passbands of a reference signal (RS) and a feedback signal (FS) which are used for coefficient update are set to be substantively the same as each other. The error calculation unit 112 compares the reference signal (RS) and the feedback signal (FS), which are to be compared with each other, in the same band, so that an error caused by a difference of bands may not be generated. Distortion rise on a part on an edge of a distortion compensation band may be reduced and distortion compensation performance may be improved by the simple configuration in which a filter in which a passband is set is provided.

Figure 3:
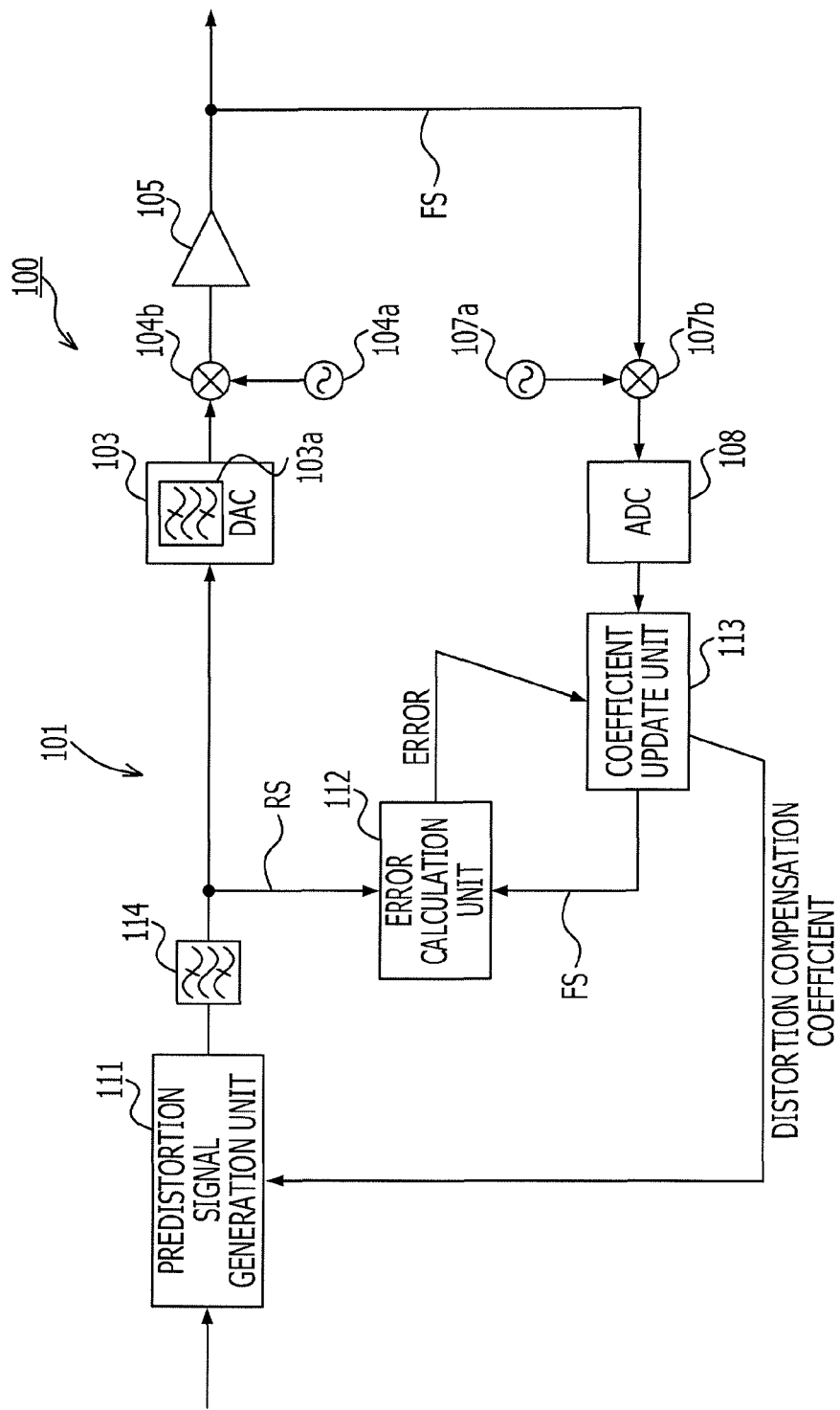
FIG. 3 illustrates an example of a distortion compensation device.

FIG. 3 illustrates an example of a distortion compensation device. In FIG. 3, the filter 114 is interposed in an output of the predistortion signal generation unit 111. The filter 114 limits both bands of a transmission signal and a feedback signal (FS). Therefore, a band of an output signal of the predistortion signal generation unit 111 may be preliminarily limited by the filter 114.

Equivalently, passbands of a reference signal (RS) and a feedback signal (FS) which are used for coefficient update are set to be substantively the same as each other. The error calculation unit 112 compares the reference signal (RS) and the feedback signal (FS), which are to be compared with each other, in the same band, so that an error caused by a difference of bands may not occur. Distortion rise on a part on an edge of a distortion compensation band may be reduced and distortion compensation performance may be improved by the simple configuration in which a filter in which a passband is set is provided.

Figure 4A:
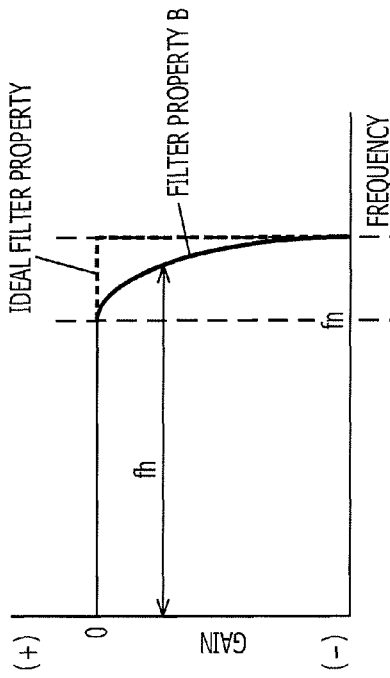
FIG. 4A to FIG. 4D illustrate an example of a passband of a filter.

FIG. 4A to FIG. 4D illustrate an example of a passband of a filter. In FIG. 4A to FIG. 4D, passbands of filters of two signals which are used for update of a distortion compensation coefficient are illustrated. The filter 103a of the DAC 103 and the filter 114 are illustrated. A horizontal axis represents a frequency and a vertical axis represents a gain. FIG. 4A illustrates a property of the filter 103a of the DAC 103. A filter property A (passband fh) of which the gain is gradually lowered from a part of a frequency fn compared to an ideal filter property is illustrated.

Figure 4B:
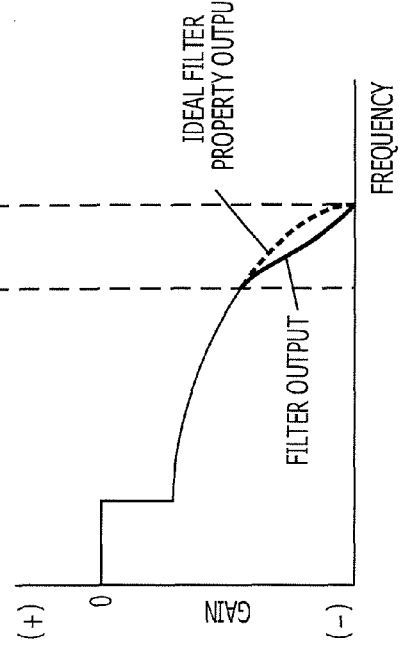

FIG. 4B illustrates a transmission spectrum of an output of the DAC filter 103a. A predistortion signal which is generated by the predistortion signal generation unit 111 is converted into an analog signal in the DAC 103 and an edge of a band of the transmission spectrum is cut by the filter 103a of the DAC 103 (reference character 401).

Figure 4C:
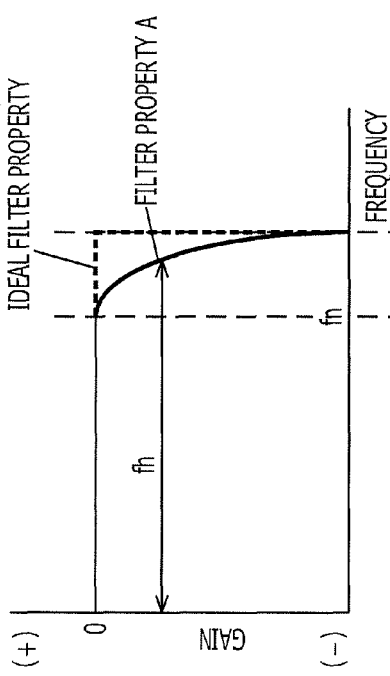
Figure 4D:
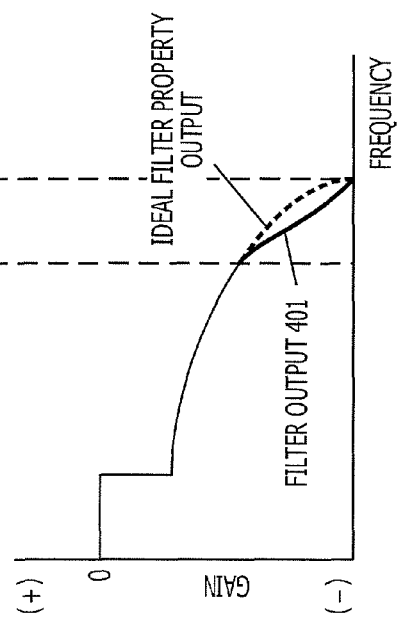

FIG. 4C illustrates a filter property of the filter 114. FIG. 4D illustrates a transmission spectrum of an output of the filter 114. A filter property B of the filter 114 is set to be substantively the same as a band limitation amount of a feedback signal (FS) such as the filter property A (FIG. 4A) of the filter 103a of the DAC 103.

Passbands of two signals which are used for update of a distortion compensation coefficient, for example, the reference signal (RS) and the feedback signal (FS) are accorded with each other, so that the two signals may be compared with each other in the substantively the same band and an error caused by a difference of bands may not be generated in the error calculation unit 112. By the simple configuration in which a filter in which a passband is set is provided, distortion rise on a part on an edge of a distortion compensation band may be reduced and distortion compensation performance may be improved.

FIG. 5A to FIG. 5D illustrate an example of a passband of a filter. In FIG. 5A to FIG. 5D, passbands of filters of two signals which are used for update of a distortion compensation coefficient are illustrated. It may be difficult to definitely accord the filter properties A and B of the two filters which are the filter 103a and the filter 114 due to difference in manufacturing and arrangement positions. Therefore, the two filter properties A and B are changed. For example, a passband fh2 of the filter property B of the filter 114 which is illustrated in FIG. 5C may be set narrower than the filter property A (passband fh1) of the filter 103a of the DAC 103 which is illustrated in FIG. 5A.

FIG. 5B and FIG. 5D illustrate transmission spectra of respective filter outputs. In the error calculation unit 112, a passband of the reference signal (RS) may be defined to be narrow. In the error calculation unit 112, two signals, for example, the reference signal (RS) and the feedback signal (FS) may be compared with each other in the substantively the same band, so that an error caused by a difference of bands may not be generated. The degree of freedom in filter designing may rise. Therefore, by the simple configuration in which a filter in which a passband is set is provided, distortion rise on a part on an edge of a distortion compensation band may be reduced and distortion compensation performance may be improved.

Figure 6:
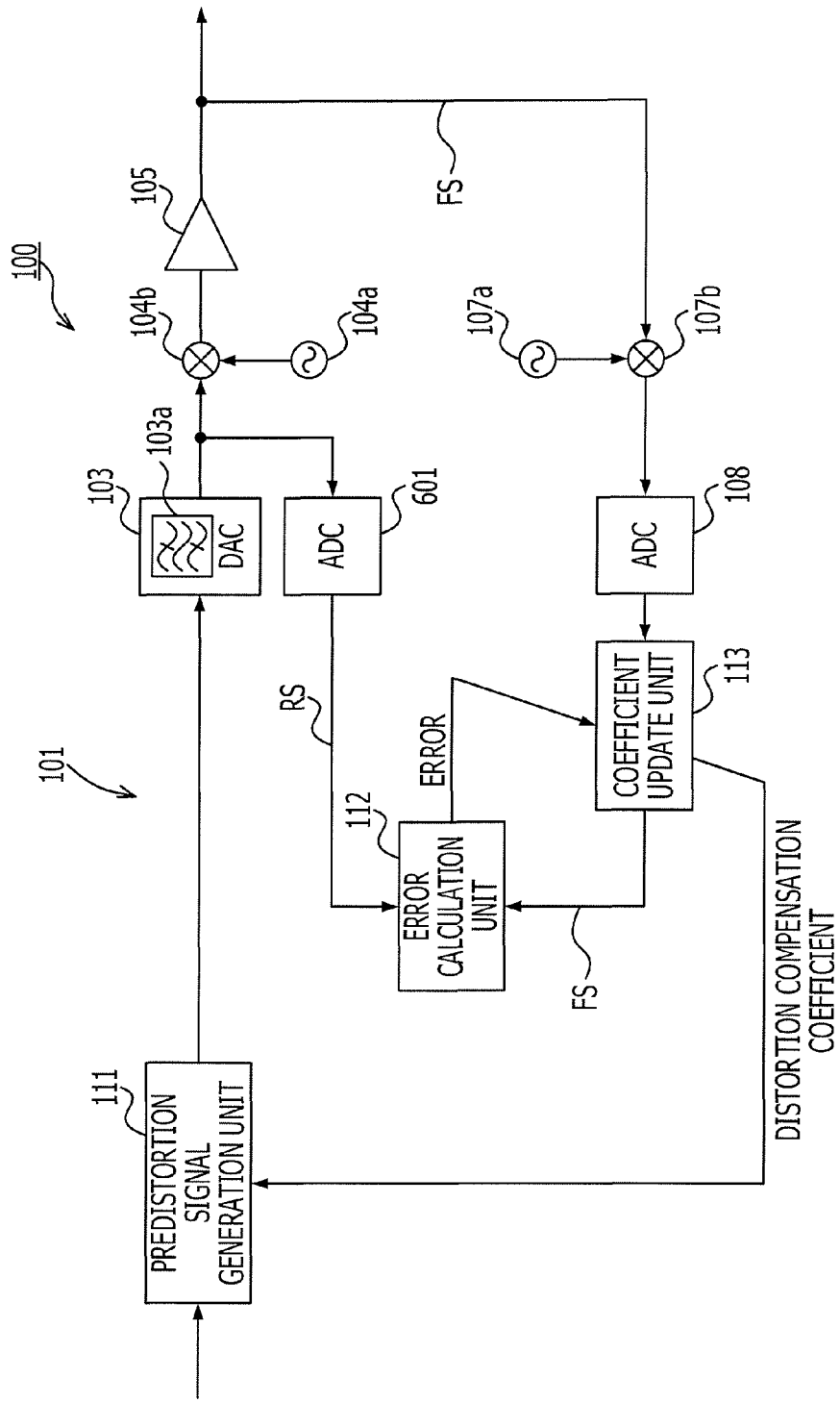
FIG. 6 illustrates an example of a distortion compensation device.

FIG. 6 illustrates an example of a distortion compensation device. In FIG. 6, the filter 114 which is disposed for the reference signal (RS) may not be provided. An output, which is obtained by inputting an output of the predistortion signal generation unit 111 into the error calculation unit 112 via the filter 114, of the error calculation unit 112 is not set as a reference signal (RS) for distortion compensation coefficient update, but an output of the DAC 103 is set as a reference signal (RS). Therefore, a second ADC 601 is provided between the DAC 103 and the error calculation unit 112 and an output of the second ADC 601 is supplied to the error calculation unit 112 as the reference signal (RS).

The filter 103*a* of the DAC 103 is commonly used on a transmission path and a coefficient update side, so that the filter 114 may not be provided. Due to a single filter property of the filter 103*a* of the DAC 103, passbands of the reference signal (RS) and the feedback signal (FS) which is AD-converted by the first ADC 108 may be substantively the same as each other. Therefore, two signals, for example, the reference signal (RS) and the feedback signal (FS) may be compared with each other in the substantively the same band, so that an error caused by a difference of bands may not be generated.

Distortion compensation performance may be improved without providing another filter having substantively the same property as that of the filter 103*a* of the DAC 103. Therefore, by the simple configuration without newly providing a filter on a reference signal side, distortion rise of a part on an edge of a distortion compensation band may be reduced and distortion compensation performance may be improved.

Bands of two signals, which are the reference signal (RS) and the feedback signal (FS) and are used for update of a distortion compensation coefficient, are limited and passbands are set to be substantively same as each other. Accordingly, error calculation is compared in the same band, so that an error caused by a difference of bands may not be generated. Distortion rise on a part on an edge of a distortion compensation band may be reduced and distortion compensation performance may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A distortion compensation device comprising:
a distortion compensator configured to output, to a power amplifier, a predistortion signal obtained by performing distortion compensation processing on a transmission signal by using a distortion compensation coefficient, wherein the distortion compensator is configured to update the distortion compensation coefficient based on an error signal between a reference signal and a feedback signal, the reference signal corresponding to the predistortion signal and the feedback signal corresponding to an output signal of the power amplifier;
a first filter provided on a signal path of the reference signal; and
a second filter provided on a signal path of the feedback signal.

2. The distortion compensation device according to claim 1, wherein the distortion compensator is configured to update the distortion compensation coefficient after limiting bands of the reference signal and the feedback signal such that the bands fall in a passband.

3. The distortion compensation device according to claim 2, wherein the first filter is configured to limit a band of the reference signal and the second filter is configured to limit a band of the feedback signal.

4. The distortion compensation device according to claim 1, further comprising:
a digital-to-analog converter configured to perform digital-to-analog conversion on an input signal, the digital-to-analog converter being disposed between the distortion compensation unit and the power amplifier; and
an analog-to-digital converter configured to perform analog-to-digital conversion on the feedback signal,
wherein the distortion compensator is configured to perform digital signal processing.

5. The distortion compensation device according to claim 1, further comprising:
a predistortion signal generator configured to perform distortion compensation processing on the transmission signal by using the distortion compensation coefficient and output the predistortion signal;
an error calculator configured to calculate an error signal between the reference signal and the feedback signal; and
a coefficient updator configured to update the distortion compensation coefficient based on the error signal that is calculated by the error calculation unit.

6. The distortion compensation device according to claim 5, further comprising:
a first filter configured to limit a band of the reference signal, wherein a passband of the first filter is set in accordance with a passband of a second filter included in the digital-to-analog converter.

7. The distortion compensation device according to claim 6, wherein the first filter is disposed on a previous stage of the error calculator which is configured to receive the reference signal.

8. The distortion compensation device according to claim 6, wherein the first filter is disposed between an output of the error calculator and the coefficient update unit.

9. The distortion compensation device according to claim 6, wherein the first filter is disposed on a following stage of the predistortion signal generator.

10. The distortion compensation device according to claim 6, wherein a passband of the first filter is set to be substantially identical to a passband of the second filter.

11. The distortion compensation device according to claim 6, wherein a passband of the first filter is set to be narrower than a passband of the second filter.

12. A distortion compensation device comprising:
a distortion compensator configured to output, to a power amplifier, a predistortion signal obtained by performing distortion compensation processing on a transmission signal by using a distortion compensation coefficient;
a digital-to-analog converter configured to perform digital-to-analog conversion, the digital-to-analog converter being disposed between the distortion compensator and the power amplifier, and including a filter having a predetermined passband;
a first analog-to-digital converter configured to perform analog-to-digital conversion on a feedback signal of the power amplifier; and
a second analog-to-digital converter configured to perform analog-to-digital conversion on an output of the digital-to-analog converter, wherein the distortion compensator is further configured to perform digital signal processing and include:
a predistortion signal generator configured to perform the distortion compensation processing on the transmission signal by using the distortion compensation coefficient and output the predistortion signal;
an error calculator configured to calculate an error signal between the reference signal and the feedback signal; and
a coefficient updator configured to update the distortion compensation coefficient based on the error signal.

13. The distortion compensation device according to claim 12, wherein the distortion compensator is further configured to include a field-programmable gate array.

14. A distortion compensation method, comprising:
performing distortion compensation processing on a transmission signal by using a distortion compensation coefficient to generate a predistortion signal;
outputting the predistortion signal to a power amplifier; and
updating the distortion compensation coefficient based on an error signal between a reference signal corresponding to the predistortion signal and a feedback signal corresponding to an output signal of the power amplifier, the reference signal being on a signal path including a first filter, and the feedback signal being on a signal path including a second filter.

15. The distortion compensation method according to claim 14, wherein passbands of the reference signal and the feedback signal are set to be substantially identical to each other.

16. The distortion compensation method according to claim 14, wherein a passband of the reference signal is set to be narrower than a passband of the feedback signal.

17. The distortion compensation method according to claim 14, wherein the updating is performed after limiting bands of the reference signal and the feedback signal such that the bands of the reference signal and the feedback signal fall in a passband.

* * * * *